(12) United States Patent
Rodov et al.

(10) Patent No.: US 7,009,253 B2
(45) Date of Patent: Mar. 7, 2006

(54) METHOD AND APPARATUS FOR PREVENTING MICROCIRCUIT THERMO-MECHANICAL DAMAGE DURING AN ESD EVENT

(75) Inventors: Vladimir Rodov, Redondo Beach, CA (US); Wlodzimierz Woytek Tworzydlo, Austin, TX (US)

(73) Assignee: ESD Pulse, Inc., Seattle, WA (US)

( * ) Notice: Subject to any disclaimer, the term of this patent is extended or adjusted under 35 U.S.C. 154(b) by 0 days.

(21) Appl. No.: 10/635,391

(22) Filed: Aug. 6, 2003

(65) Prior Publication Data

US 2005/0029596 A1 Feb. 10, 2005

(51) Int. Cl.
  *H01L 23/62* (2006.01)
(52) U.S. Cl. ............... 257/355; 257/546; 257/633; 257/747
(58) Field of Classification Search ........... 257/355, 257/546, 469, 633, 747, 915
See application file for complete search history.

(56) References Cited

U.S. PATENT DOCUMENTS

| | | |
|---|---|---|
| 5,537,284 A | 7/1996 | Haas, Jr. et al. |
| 5,689,133 A | 11/1997 | Li et al. |
| 6,034,388 A | 3/2000 | Brown et al. |
| 6,153,913 A | 11/2000 | Hsu et al. |
| 6,157,530 A | 12/2000 | Pequignot et al. |
| 6,259,139 B1 * | 7/2001 | Pan ........................... 257/335 |
| 6,262,873 B1 | 7/2001 | Pequignot et al. |
| 6,268,286 B1 | 7/2001 | Gauthier, Jr. et al. |
| 6,292,343 B1 | 9/2001 | Pequignot et al. |
| 6,331,726 B1 | 12/2001 | Voldman |
| 6,353,236 B1 * | 3/2002 | Yatsuo et al. ............... 257/77 |
| 6,436,744 B1 * | 8/2002 | Bryant et al. ............... 438/151 |
| 6,560,105 B1 | 5/2003 | Roy et al. |
| 6,674,129 B1 | 1/2004 | Colclaser et al. |
| 6,734,093 B1 * | 5/2004 | Sabin et al. ............... 438/614 |
| 2002/0070424 A1 * | 6/2002 | Uenishi ...................... 257/536 |

OTHER PUBLICATIONS

Test Structures for Benchmarking the Electrostatic Discharge (ESD) Robustness of CMOS Technologies, Sematech, Inc., Feb. 27, 1998.
Characterization, Modeling, and Design of ESD Protection Circuits, Stephen G. Beebe, Advanced Micro Devices, Mar. 1998.
Investigation of ESD Performance in Advanced CMOS Technology, A dissertation Submitted to the Department of Electrical Engineering and the Committee on Graduate Studies of Stanford University in Partial Fulfillment of the Requirements for the Degree of Doctor of Philisiphy, Kwang-Hoon Oh, Oct. 2002.
Lighting Rods for Nanoelectronics, Steven H. Voldman, *Scientific American*, vol. 287, No. 4, Pgs. 90-97, Oct. 2002.

* cited by examiner

Primary Examiner—Tom Thomas
Assistant Examiner—Matthew E. Warren
(74) Attorney, Agent, or Firm—Myers Dawes Andras & Sherman, LLP.

(57) ABSTRACT

A method and apparatus for preventing thermo-mechanical damage to an electrostatic discharge (ESD) protection device is disclosed. The method and apparatus of the invention use materials with superior thermo-mechanical properties, in particular, the Coefficient of Thermal Expansion (CTE), melting temperature, tensile strength and fracture toughness. The thermo-mechanical energy absorber materials are incorporated in, or replace, components of the ESD device that are susceptible to thermo-mechanical stress and cracking due to localized heating and thermal expansion.

10 Claims, 5 Drawing Sheets

METHOD AND APPARATUS FOR PREVENTING MICROCIRCUIT THERMO-MECHANICAL DAMAGE DURING AN ESD EVENT

BACKGROUND OF THE INVENTION

1. Field of the Invention

The present invention generally relates to microelectronic devices and methods of assembly and operation. In particular, the present invention relates to circuit configurations and methods designed to reduce the harmful effects of electrostatic discharge in such devices.

2. Description of the Related Art

Electrostatic Discharge (ESD) is a significant problem in microelectronic devices and results from high voltage and/or current applied to the terminals of microelectronic devices by human or machine contact during the device manufacturing, assembly, transportation, storage or PC board mounting. The voltage and current spikes are typically of a very short duration and can cause breakdown of such devices, thus rendering them inoperable. This is a problem of increasing importance as smaller and smaller device dimensions render them more susceptible to damage.

To protect microelectronic devices from the harmful effects of ESD, dedicated ESD protection circuits are commonly employed. Typically, such circuits are designed to divert ESD pulses from the device without affecting its performance under normal operating conditions. Nonetheless, in practice ESD impulses often destroy both the protection circuit and the protected device, even with ESD protection devices designed using state-of-the-art methods.

One of the underlying reasons for failure of prior art ESD protection devices is that their design is based on an incomplete understanding of the mechanisms by which an ESD pulse destroys the device. It is commonly understood in the prior art that the damage due to ESD pulses happens via:

1. Electrical breakdown of electronic structure due to high current that changes the operating characteristics of the device followed by
2. thermal breakdown, wherein the high temperature induced by the pulse causes local current instabilities (e.g. filamentation) that leads to melting of the semiconductor, contacts and/or other elements of the device.

For ESD protection circuits, it is the thermal breakdown that is typically used as the principal design criterion. However, experimental evidence indicates that there must exist other phenomena that contribute to failure of ESD protection circuits even before the melting point has been reached. This is confirmed by poor reliability and unpredictable performance of ESD protection circuits designed according to the prior art.

Accordingly, in view of the problems and deficiencies of the prior art, a need exists to improve the reliability and performance of ESD protection devices, and additionally improve the survivability of microelectronic devices subjected to ESD events. Further, it is important that such an improved approach be relatively inexpensive to implement.

SUMMARY OF THE INVENTION

The present invention provides an integrated circuit incorporating an Electrostatic Discharge (ESD) protection device comprising a semiconductor substrate; an electrical contact pad; an ESD switch coupled to the pad also having an active device region formed in the semiconductor substrate; and a thermal energy absorbing region formed in the semiconductor substrate in thermal contact with the active device region made from a material substantially more resistant to thermo-mechanical expansion than the active device region.

The material substantially more resistant to thermo-mechanical expansion preferably has a thermal expansion coefficient lower than approximately $5 \times 10^{-6 \circ}$ $K^{-1}$, a melting temperature higher than approximately 2000° K, a tensile strength higher than approximately 300 MPa (Mega Pascals), and a fracture toughness approximately higher than about 1.0 MPa $m^{1/2}$. In a preferred embodiment, the ESD switch is a transistor (e.g. MOSFET structure) and the thermo-mechanical absorbing region is in direct contact with the active device region. A preferred MOSFET structure has an active device region that comprises: a source region; a drain region; and a channel region between the source region and the drain region. Alternatively, the ESD switch is a diode.

The material substantially more resistant to thermo-mechanical expansion than the active device region may be selected from the group consisting of diamond, boron nitride, silicon carbide or carbon. The ESD switch itself may include a resistor or a capacitor.

In another aspect the present invention provides an integrated circuit incorporating an Electrostatic Discharge (ESD) protection device comprising a semiconductor substrate; an electrical contact pad; a plurality of active devices formed on the substrate; a first connector formed of a first electrically conductive material connecting the plurality of active devices; and an ESD switch coupled to the pad, at least in part via a second connector. Further, the ESD switch has an active device region in the semiconductor substrate. The second connector is electrically connected to the ESD switch and comprises material more resistant to thermo-mechanical expansion than the first connector formed of the first electrical conductive material wherein the second connector extends away from the substrate a distance at least equal to one-half of the length of the active device region, the length being in the x-y direction, and not in the z-direction. The connector material substantially more resistant to thermo-mechanical expansion has a thermal expansion coefficient lower than approximately $10 \times 10^{-6 \circ}$ $K^{-1}$, a melting temperature higher than approximately 1500° K, a tensile strength higher than approximately 200 MPa (Mega Pascals), and a fracture toughness approximately higher than 1.0 MPa $m^{1/2}$. Alternatively, the material resistant to thermo-mechanical expansion is composed primarily of titanium nitride (TiN), or primarily of carbon (C), or it is composed primarily of an alloy of aluminum (Al) and TiN.

Another aspect of the invention provides an integrated circuit incorporating an Electrostatic Discharge (ESD) protection device comprising a semiconductor substrate; an electrical contact pad; a connector electrically connected to the electrical contact pad; and an ESD switch coupled to the pad, at least in part via the connector, said ESD switch having an active device region in the semiconductor substrate, and wherein said semiconductor substrate comprises a thermo-mechanical energy sink fabricated from material resistant to thermo-mechanical expansion, the material having physical properties including a low thermal expansion coefficient lower than approximately $5 \times 10^{-6 \circ}$ $K^{-1}$, a high melting temperature approximately higher than 2000° K, a high fracture toughness higher than about 1.0 MPa $m^{1/2}$. In this embodiment, the Electrostatic Discharge (ESD) protection further comprising a grounded back contact electrically coupled to the semiconductor substrate, so that when an ESD event occurs producing an ESD current, the current is shunted from the ESD protection device through thermo-mechanical energy sink and through the grounded back contact. In a preferred embodiment, the active device region comprises the thermo-mechanical energy sink. Alternatively, the semiconductor substrate is fabricated from the material resistant to thermo-mechanical stress. The material resistant to thermo-mechanical expansion is selected from a group consisting of diamond, hard carbon or boron nitride.

In another aspect, the invention provides an integrated circuit comprising a semiconductor substrate; a core circuit comprising a plurality of devices having electrical connectors and active device regions formed in the semiconductor substrate and one or more electrical insulator regions; and an ESD circuit comprising an active device having an active device region formed in a substrate material, one or more electrical connectors, and one or more electrical insulator regions, and one or more passive circuit components. At least one of the substrate material, electrical connectors, active device region, passive circuit components or electrical insulator is composed in whole or in part of a material substantially more resistant to thermo-mechanical damage than the corresponding structure in the core circuit devices. The passive circuit component may be a resistor or a capacitor. In one embodiment, the ESD switch is spaced apart from the core circuitry by at least 10 microns. The material more resistant to the thermo-mechanical damage comprises a material having a substantially lower coefficient of thermal expansion, and at least one of connectors of the ESD circuit comprises carbon.

In another aspect, the invention provides an integrated circuit, comprising a semiconductor substrate; a core circuit comprising a plurality of devices having electrical connectors and active device regions formed in the semiconductor substrate and one or more electrical insulator regions; and an ESD switch having means, integrated with the switch structure, for preventing thermo-mechanical damage due to an ESD event.

In another aspect, the invention provides a method of fabricating an ESD device on a semiconductor substrate, the method comprising fabricating an ESD switch from one or more connectors and one or more active device regions formed in the semiconductor substrate; providing a region composed of a material resistant to thermo-mechanical expansion, the region in thermal contact with said switch, wherein the material has physical properties including a low thermal expansion coefficient lower than approximately $5 \times 10^{-6}$ K$^{-1}$. The material used in the method has material having physical properties further including a high melting temperature higher than approximately 2000° K, a high tensile strength higher than approximately 300 MPa (Mega Pascals), a high fracture toughness higher than approximately 1.0 MPa m$^{1/2}$.

Further objects, advantages and features of the present invention will become apparent to those skilled in the art from the following detailed description, when read in conjunction with the accompanying drawings.

DETAILED DESCRIPTION OF THE INVENTION

First, the modeling of ESD damage underlying the approach of the present invention will be described.

There are three basic models conventionally used to describe different types of ESD events: the Human Body Model (HBM), the Machine Model (MM) and the Charged Device Model (CDM). The Human Body Model, representative of a charged person touching the electronic device, assumes that a human is charged to around several kilovolts (KV) and is represented by a capacitance of about several hundred pico farads that can discharge through a resistor of a few kilo ohms. For example, such an arrangement can generate a 4 KV pulse with a maximum current of 2.6 A and about 150 ns event time. The Machine Model, representative of a charged tool touching the device as a typical example, assumes that a 400 V pulse is discharged with a maximum current of 7 A and an event duration of 10 to 50 ns. In the Charged Device Model corresponding to contact or grounding of charged devices, the event time is extremely short (about 0.25 ns) with voltages reaching about 1 KV and currents on the order of 10 A.

As discussed above, prior approaches to modeling ESD and designing ESD protection focus on electrical breakdown and melting due to localized high currents. Such approaches fail to appreciate and compensate for a different class of microelectronic device damage due to ESD. In particular, the present inventors have discovered that ESD damage also occurs through a thermo-mechanical mechanism as described below. This discovery was confirmed through analytical and numerical ESD event simulations incorporating mechanical deformation analysis of the device structure.

1. ESD discharge causes very fast local heating, which occurs within relatively small volumes. The local heating causes, through thermal expansion of materials, intense mechanical stress and deformation. Such effects will typically occur in all three types of ESD events; i.e. HBM, MM and CDM events.

2. Depending upon the rate of temperature increase, mechanical vibrations or elastic waves may be triggered in the device, further compounding mechanical stress intensity. These effects will typically become more significant for fast ESD events such as MM events and in particular, CDM events.

The stress intensity caused by thermo-mechanical effects 1, and 2, may surpass the strength of the integrated circuit (IC) chip materials and/or interfaces between different layers, leading to plastic deformation, cracking and/or delamination within the chip. The cracks provide an additional barrier to current flow and/or heat dissipation in consecutive ESD events and thus compound the destructive effects. These thermo-mechanical mechanisms can destroy chips, or begin a process of destruction of chips, at temperatures well below the melting point recognized in the prior art.

Figure 1:
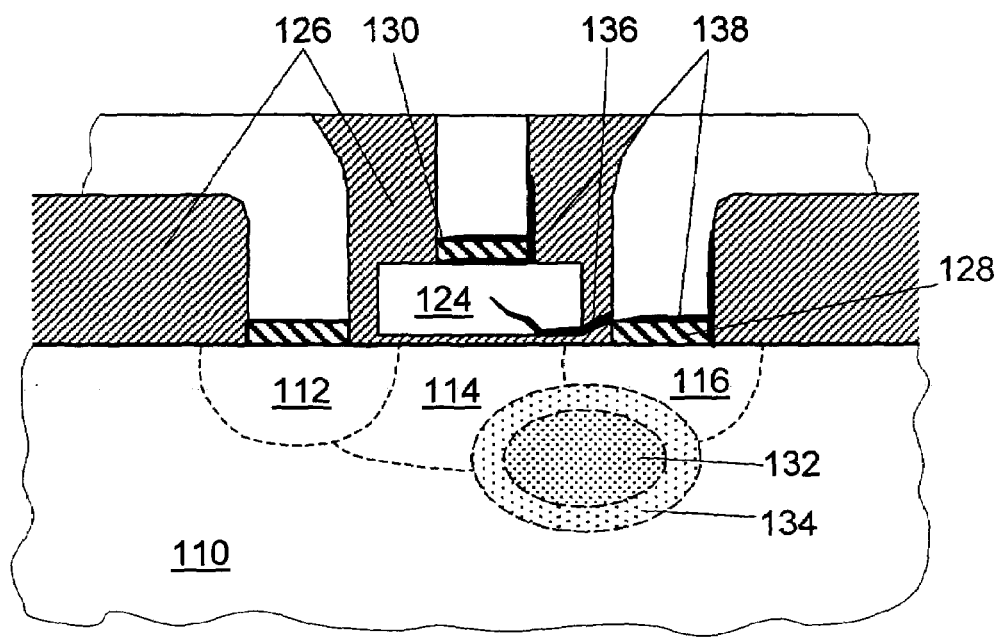
FIG. 1 is a cross-sectional illustration of a prior art integrated circuit incorporating an electrostatic discharge (ESD) protection device that has undergone thermo-mechanical damage due to an ESD event.

More specifically, referring to FIG. 1, the primary areas and types of thermo-mechanical damage that can be caused by effects 1, and 2, above during ESD events are illustrated. The ESD protection device of FIG. 1 is a typical example of a MOSFET switch used in an ESD protection circuit. The MOSFET switch is formed in substrate 110, part of an IC substrate typically of single crystal silicon. The gate contact 120 and drain 116 (or source 112) are coupled to the IC pad and ideally the switch will turn on and shunt ESD current harmlessly to ground in an ESD event on the pad. By way of reference, as will be appreciated by those skilled in the art, the components of the MOSFET device also include, channel 114, drain contact 118, source contact 122, gate 124, and dielectric material 126. The connectors are typically aluminum or aluminum-silicon-copper alloy and the dielectric is typically silicon dioxide ($SiO_2$). A thin contact diffusion barrier 128 (e.g. titanium nitride TiN) is also shown. The types of thermo-mechanical damage illustrated include delamination 138 and separation of connectors 118, 120, 122 and other elements of the device. Another aspect of thermo-mechanical failure is crack propagation 136 from high-stress areas, especially from connectors 118, 120, 122, and adjacent etched or deposited areas formed during fabrication. A third type of damage is plastic deformation 134 of the substrate 110 around the heated area epicenter 132 with resulting destruction of its single-crystal structure. Depending upon the type of device and localization of thermal heating the cracking, delamination and plastic deformation may occur in different areas than shown in FIG. 1.

The present invention provides circuit designs and methods that minimize these thermo-mechanical effects of ESD discharge on the components of the ESD device.

Figure 2:
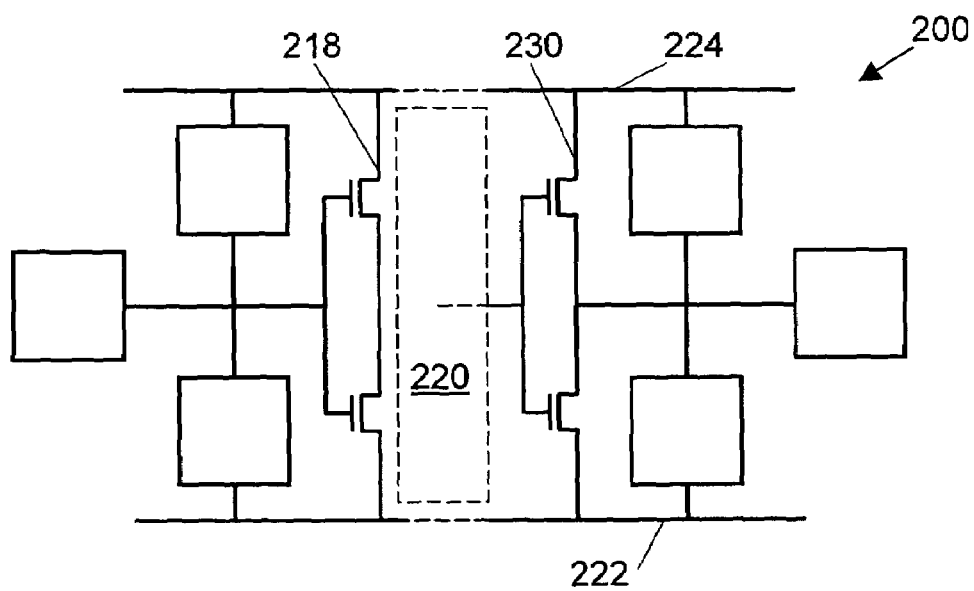
FIG. 2 is a circuit block diagram of a microelectronic circuit employing improved ESD protection in accordance with the present invention.
Figure 4:
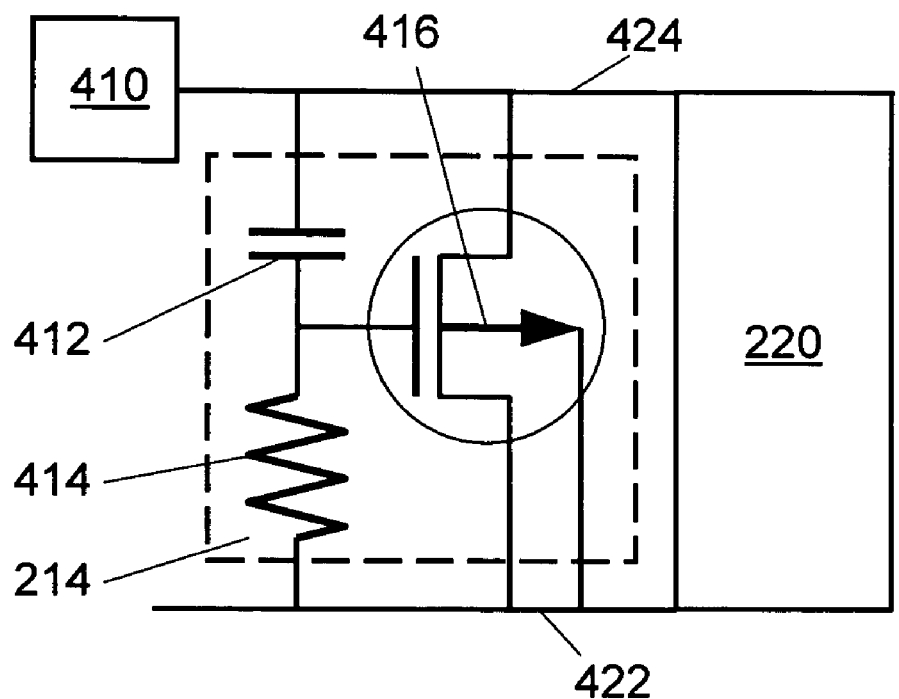
FIG. 4 is a circuit block diagram of another microelectronic circuit layout employing improved ESD protection in accordance with the present invention.

In FIG. 2, a block diagram of a microelectronic circuit 200 having improved ESD protection in accordance with the present invention is illustrated. The circuit 200 may comprise any type of microelectronic circuit requiring ESD protection and will typically comprise an IC having core circuitry 220 having many thousands or millions of devices on an IC substrate. Input/output ESD protection circuitry 214, 216, 226, 228 protects the core circuitry 220 from ESD pulses applied to pads 210, 212. The protection circuitry shields the I/O buffers 218, 230 from the stress by clamping the voltage at I/O pads 210, 212 below the breakdown level. At the same time, the protection circuitry effectively shunts the ESD current to the ground 222 without going through internal circuitry 220. A variety of devices, such as diodes, bipolar transistors, SCRs or MOSFETs can be used in circuitry 214, 216, 226 and 228, usually in conjunction with resistors, as efficient input protection switches. One specific switch configuration is shown in FIG. 4. The present invention is not limited to a specific switch, however, since the main purpose of any switch is to release the ESD energy into surrounding materials where it can be dissipated. Hence, the thermo-mechanical damage modes shown above and respective remedies discussed below, apply to any such switch.

Figure 3:
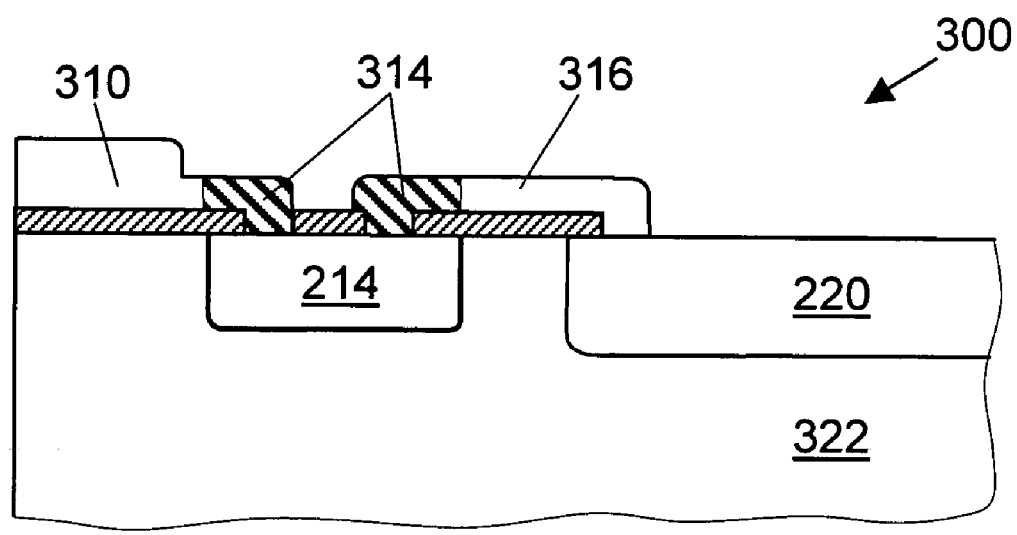
FIG. 3 is an illustration showing a vertical portion of a cross section of the microelectronic circuit of FIG. 2.

FIG. 3 illustrates generally the physical arrangement of an ESD protection circuit 214 in relation to the IC substrate. The figure shows a vertical cross section of a microelectronic circuit 200 implemented as an IC chip 300. The ESD protection circuit 214 is typically located below the input pad 310 and is spaced apart from the main circuitry 220 (usually at a distance of at least ten or more microns). IC substrate 322 may be single crystal silicon or other known IC substrate. The active devices in core region 220 will include doped regions in the substrate 322 as known in the art. For example, if they contain MOSFET devices, they may generally have the form shown in FIG. 1. Connectors 316 may be conventional materials such as aluminum. Connectors 314, i.e. the portion of the electrical connection within a distance from the pad 210 subject to thermo-mechanical effects, will preferably be a hybrid structure including at least a portion of a thermo-mechanical damage resistive material, as discussed in detail below.

The present invention has a very broad application in that it improves ESD resistance to thermo-mechanical failure under all ESD event types (i.e. HBM, MM, CDM). As described in more detail below in relation to specific embodiments, the vulnerable materials (aluminum, copper, and possibly silicon) of conventional ESD switches are replaced, in whole or in part, with materials substantially more resistant to thermo-mechanical stress. The specific materials are chosen from the many known materials having the desired properties. Although specific examples are given below, without limitation, more generally materials having the following physical properties (in comparison to materials presently used) may be used.

1. Very low thermal expansion. This minimizes the thermal stresses and the dynamic energy induced by fast heating. The less thermal expansion, the less thermo-mechanical stress.
2. High strength and, preferably, low brittleness.
3. High melting temperature. Although this is not directly related to the thermo-mechanical damage mechanisms described here, it is generally desirable for such materials to have high melting temperature, to effectively resist the currently recognized "melting" mechanism of failure under ESD discharge.

As will be appreciated by those skilled in the art, different material types are used to perform different functions in ESD switches for a particular IC. Therefore, the desired "low" or "high" material properties are relative, depending on the materials commonly used in the application which are replaced for increased thermo-mechanical failure resistance. Specific examples will be provided below to clarify these material properties although these should not be viewed as limiting in nature. FIG. 4 shows a specific example of an input protection circuit that uses a resistor 414 and a capacitor 412 along with an nMOS transistor 416. The nMOS transistor 416 acts as a switch and is off during normal operation. During an ESD event, the nMOS transistor 416 enters into the ESD protection mode, clamping the voltage on the pad 410 below the breakdown levels. The additional resistor 414 and capacitor 412 serve to adjust the breakdown voltage that activates ESD protection. Cross-referencing to FIGS. 2 and 3, the ESD protection circuit 214 may thus comprise transistor 416, resistor 414 and capacitor 412 in an embodiment.

Figure 5:
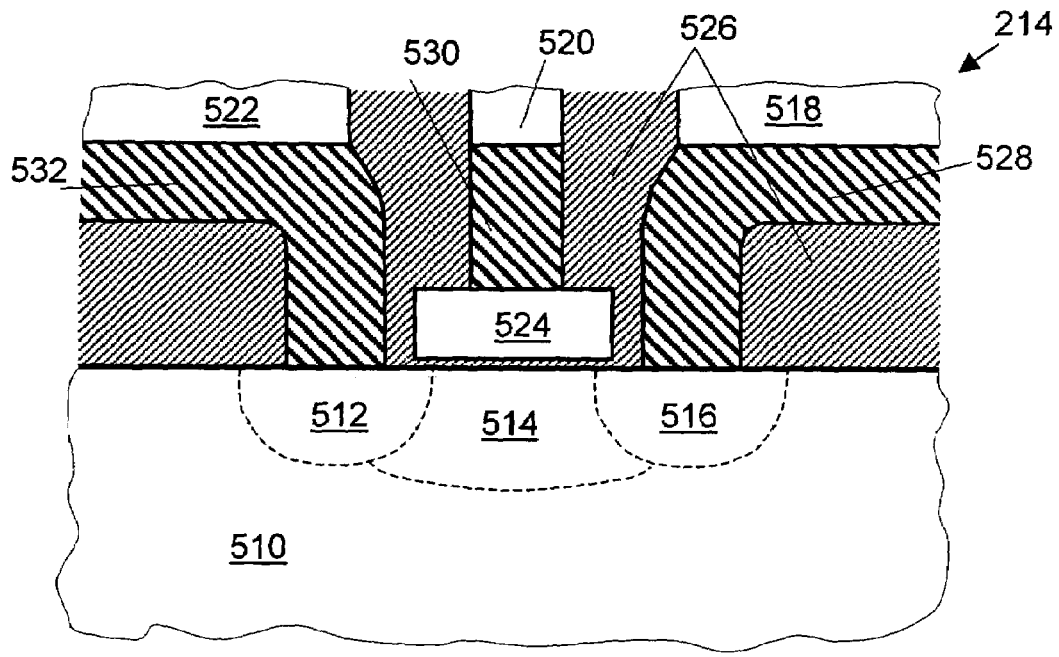
FIG. 5 is an illustration showing a vertical cross section of an ESD protection circuit in accordance with a first embodiment of the present invention wherein the connectors are made from material resistant to thermo-mechanical stress.

Referring to FIG. 5, a first specific example of an improved ESD switch is provided. The specific structure corresponds to a MOSFET switch such as switch 416 shown in FIG. 4. However, the modifications can equally be applied to any other switch type, such as bipolar transistor, SCR or other known ESD switch type. Similarly, the modifications can be applied to other components of ESD protection circuit, and in particular passive circuit components such as capacitor 412 and resistor 414. The switch includes source region 512, channel region 514, and drain region 516 formed in substrate 510. The connectors 528, 530, and 532 are fabricated from a material selected from the group of materials sharing the following properties.
1. Low thermal expansion that is defined by the Coefficient of Thermal Expansion (CTE) being lower than $10.0 \times 10^{-6\circ}$ $K^{-1}$ (per degree Kelvin) and, more preferably, lower than $5.0 \times 10^{-6\circ}$ $K^{-1}$ and ideally lower than $2.0 \times 10^{-6\circ}$ $K^{-1}$.
2. High melting temperature that is defined by a melting point being higher than 1500° K and, more preferably, higher than 3000° K.
3. High strength that is defined by the Tensile Strength for bulk material (samples that have cross-section of 2 mm or higher) being higher than 200 MPa (Mega Pascals) and a Fracture Toughness being higher than 1.0 MPa $m^{1/2}$. It should be noted that the strength criterion is of lesser importance for connectors than the other two criteria.

It should be additionally noted that material properties usually change with temperature—for example material strength typically decreases as melting temperature is approached. Hence, while it is desirable that the materials maintain the specified properties at the whole range of operating temperatures, the values given in this application refer to standard measurements at room temperature.

Examples of desirable connector materials are titanium nitride (TiN), graphite, and carbon (C). Alternatively, connectors 528, 530, 532 may comprise an alloy containing significant portions of such material used in conjunction with aluminum or copper.

In this embodiment, aluminum (Al) or copper (Cu) contacts 518, 520, 522 in the vicinity of the heated area are replaced by a conductor with high resistance to thermo-mechanical stress as defined above. As a result, a hybrid connector structure is formed as Al or Cu contacts 518, 520, and 522 are still used in the present invention to facilitate connections with the core circuitry and external wires (not shown). In relative terms, the distance the material (e.g. TiN, graphite or C) used in connectors 528, 530, 532 extends from the substrate, for example, should be approximately one half of the length of the active device region (defined in this embodiment by the lateral extension of the current flow direction through the source 512, channel 514 and drain 516 regions collectively). In absolute terms, the minimum thickness of the layer can vary from 50A to 5,000A; however, this range may easily change henceforth, because microelectronic devices continually get smaller with advancement.

Although connectors 528, 530 and 532 may be formed of TiN such connectors are much different then known TiN diffusion barriers. Referring back to FIG. 1, TiN diffusion barriers 128, 130 are used on the connectors 118, 120, and 122. Titanium nitride material as used in the prior art has the function of preventing diffusion of the aluminum (Al) connector 118 into the substrate 110 during alloying. These barriers are inadequate to limit thermo-mechanical damage, and can make it worse due to cracking at the TiN—Al interface. It should be noted that FIG. 1 shows cracking not within the TiN, but delamination 138 of Aluminum from TiN (although TiN could possibly also crack due to increasing pressure from Al). Importantly, the primary source of damage in this case is Al due to its heating causing cracking from the pressure of thermal expansion. In contrast to the prior art use of a very thin layer of TiN 128, 130, the present invention employs a hybrid connector structure containing substantially more TiN material (or graphite, or C) for thermal-mechanical damage resistance. In particular, TiN (or graphite, or C) is used in lieu of Al in the area affected by high temperatures due to ESD pulse.

Figure 6:
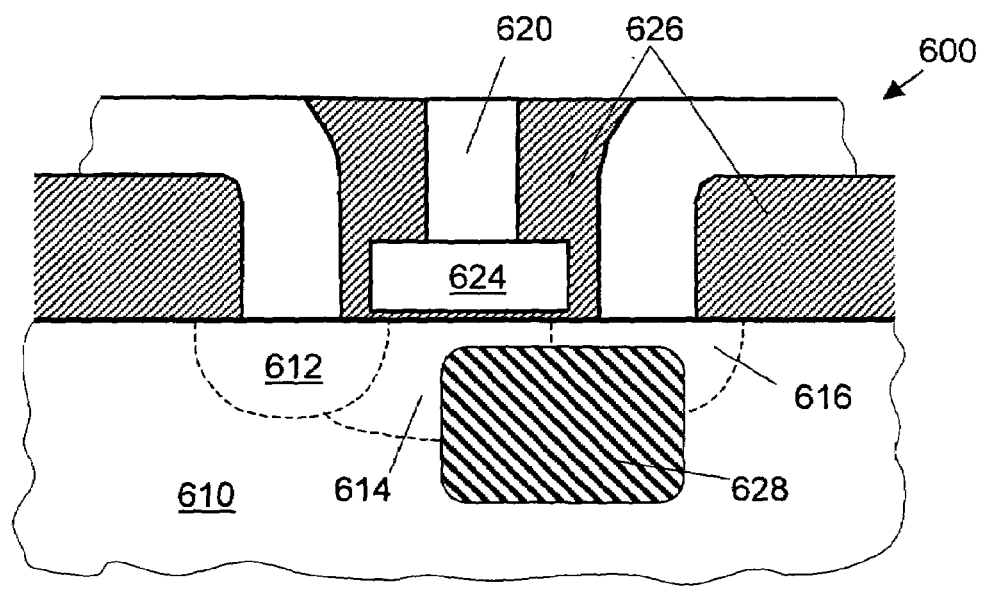
FIG. 6 is an illustration showing a vertical cross section of an ESD protection circuit in accordance with another embodiment of the present invention wherein a thermo-mechanical energy sink is included in the active device area of the substrate.
Figure 7:
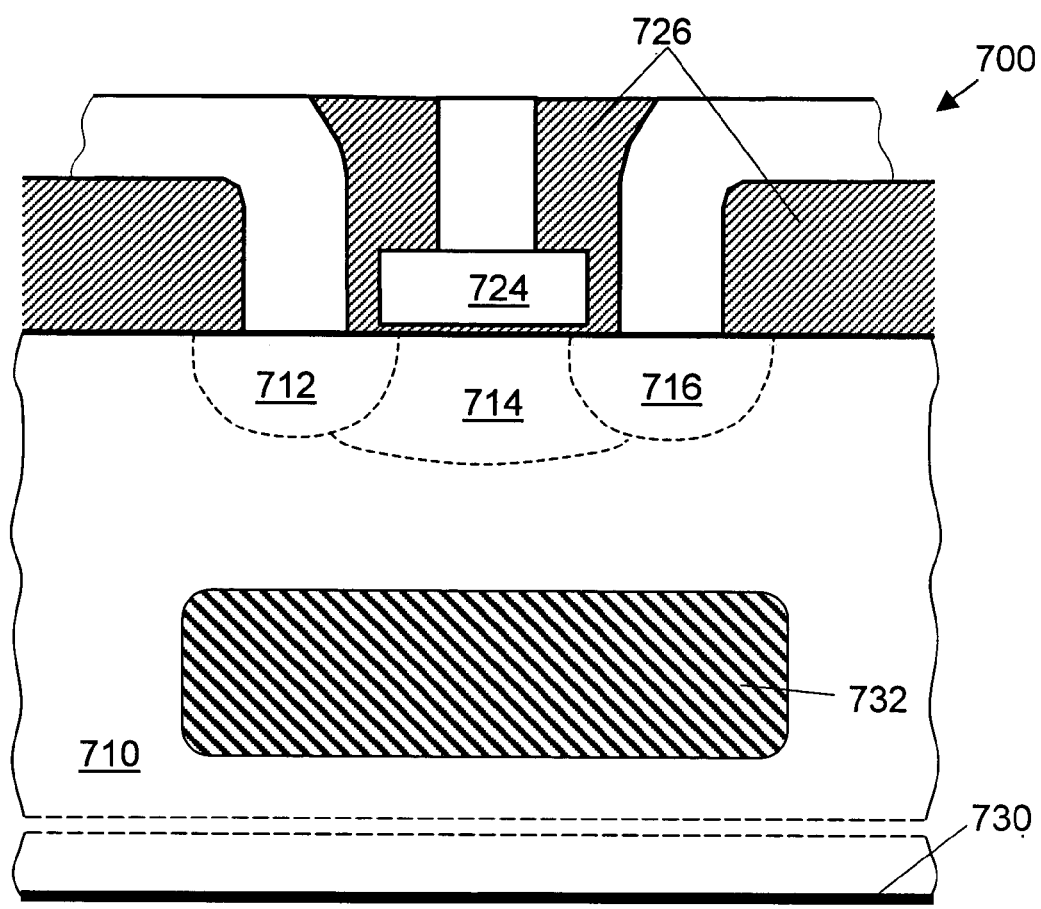
FIG. 7 is an illustration showing a vertical cross section of an ESD protection circuit in accordance with another embodiment of the present invention wherein a thermo-mechanical energy sink is included in the substrate below the active area.
Figure 8:
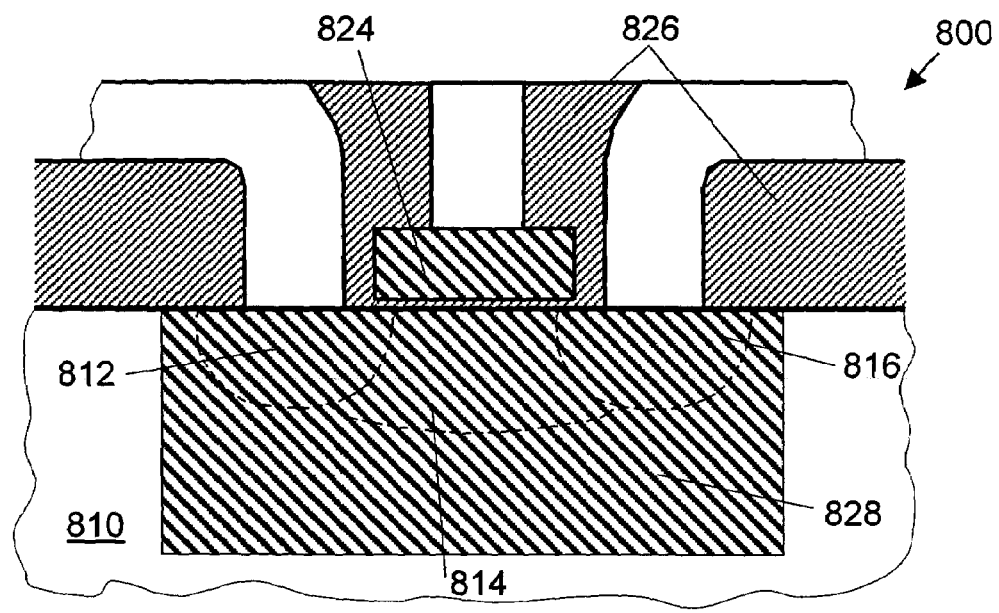
FIG. 8 is an illustration showing a vertical cross section of an ESD protection circuit in accordance with another embodiment of the present invention wherein the entire active device area is made from material resistant to thermo-mechanical stress.

Referring to FIGS. 6–8, an alternative embodiment of an improved ESD switch is shown. To minimize the effects of thermal expansion within the silicon, the present invention employs within the heated area a "thermo-mechanical energy sink" or "energy absorber," that is made of the material resistant to thermo-mechanical stress. As in the case of the embodiment of FIG. 5 a MOSFET switch is shown, but again the modifications may be applied to any known ESD switch or other element of ESD protection circuitry.

Referring first to FIG. 6, the switch 600 includes an active device region comprising source 612, channel 614, and drain 616. Gate 624 is in the area above the active device region. In the embodiment shown in FIG. 6, a thermo-mechanical energy sink 628 is introduced within the substrate 610 (e.g. silicon) in the area where the heat energy is generated. Electrically, the material of the energy sink participates in the operation of the switch 600, serving as a semiconductor, resistor, etc. The switch 600 is designed so that most of the energy dissipation and heating is concentrated within the energy sink 628. The energy sink 628, through its special properties as listed above, and in more detail below, is extremely resistant to thermo-mechanical stress and thus helps the switch 600 sustain a much higher current than the prior art.

In another embodiment shown in FIG. 7, a thermo-mechanical energy sink is introduced within a switch 700 that is constructed to release excess current into the IC back contact 730. The primary energy dissipation area is located below the active device region that is defined by the source 712, channel 714, and drain 716 regions. The energy sink 732 is located in this energy dissipation area, serving both as a resistor that dissipates the electrical current energy and as a buffer resistant to thermo-mechanical stress. The grounded back contact 730 serves as a shunt path to facilitate the dissipation of current and associated thermal energy and is a known ESD device configuration.

In another embodiment shown in FIG. 8, the entire active device area 812, 814, 816, of the switch 800 (the area where electrical field and current flow are essentially non-zero) is made of semiconductor material that serves as a thermo-mechanical energy sink 828, resistant to thermo-mechanical stress and thermal expansion. Also, the gate 824 may be made of this material. Through the special properties of this material are as listed above, and in more detail below, the switch 800 is extremely resistant to thermo-mechanical stress and thus helps in sustaining a much higher current than in the prior art.

Applicable to FIGS. 6, 7, and 8, the energy sink, including a portion of the substrate, and the components such as resistors and capacitors therein, as well as the gate material, should be fabricated from material with the following material properties.
1. Low thermal expansion that is defined by the Coefficient of Thermal Expansion (CTE) being lower than $5.0 \times 10^{-6}$ $K^{-1}$, more preferably lower than $2.0 \times 10^{-6}$ $K^{-1}$, and ideally lower than $0.5 \times 10^{-6}$ $K^{-1}$.

2. High melting temperature that is defined by Melting Point being higher than 2000° K and, more preferably, higher than 3500° K.
3. High strength that is defined by Tensile Strength for bulk material (samples of cross-section of 2 mm or higher) being higher than 300 MPa (Mega Pascals) and Fracture Toughness being higher than 1.0 MPa m$^{1/2}$. More preferably, a tensile strength of bulk material above 600 MPa and fracture toughness above 3.0 MPa m$^{1/2}$ is desired.

Some examples of preferred semiconductor, resistor and capacitor materials include: diamond, hard carbon (i.e. diamond-like carbon, amorphous carbon), boron nitride, and less preferably, silicon carbide. All materials may be doped as needed for electrical properties.

Figure 9:
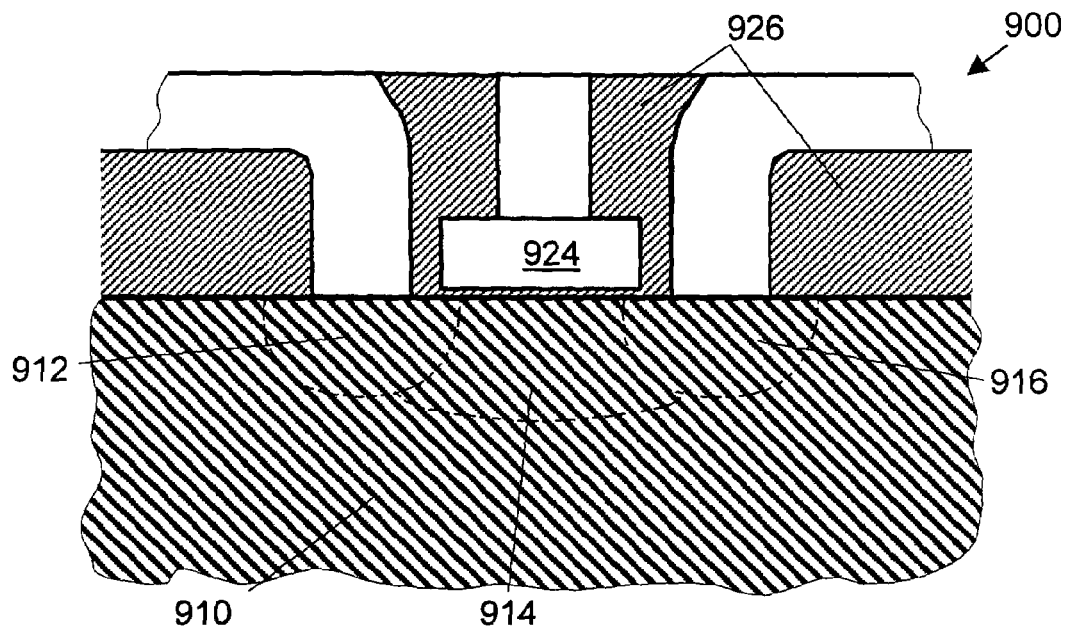
FIG. 9 is an illustration showing a vertical cross section of an ESD protection circuit in accordance with another embodiment of the present invention wherein the substrate is made from material resistant to thermo-mechanical stress.

As a further embodiment according to FIG. 9, the entire ESD protection switch 900 is constructed on a substrate 910 made of a thermo-mechanical stress resistant material (e.g. diamond, hard carbon, boron nitride or silicon carbide instead of silicon). Also, the gate 924 and other semiconductor elements may be constructed from this material. Such a switch 900 can be either added to a main circuit in a hybrid arrangement, or will be placed on top of an isolation layer, deposited separately (e.g. on top of a chip's passivation layer). Alternatively, a layer of normal epitaxial silicon can be formed on a thermo-mechanical resistant substrate 910 with the ESD switch formed in the epitaxial layer.

It is desirable that any other materials present in the zone heated by an ESD pulse should satisfy some or all of the following desired property ranges (in the order of importance):

1. Low thermal expansion defined by the Coefficient of Thermal Expansion CTE being lower than $5.0 \times 10^{-6}$ K$^{-1}$; more preferably lower than $2.0 \times 10^{-6}$ K$^{-1}$.
2. High melting temperature defined by a melting point being higher than 2000° K and, more preferably, higher than 3500° K
3. High strength defined by Tensile Strength for bulk material (samples of cross-section of 2 mm or higher) being higher than 300 MPa (Mega Pascals) and Fracture Toughness being higher than 1.0 MPa m$^{1/2}$. More preferably, a tensile strength of bulk material above 500 MPa and fracture toughness above 3.0 MPa m$^{1/2}$ is desired.

The fabrication processes for an ESD protection device with improved resistance to thermo-mechanical stress are also applicable to the present invention. A primary fabrication process is a method for inserting a material with desirable thermo-mechanical properties, such as hard carbon or diamond like carbon, amorphous carbon, boron nitride or silicon carbide, under the ESD protection switch. The method first employs depositing an oxide layer onto a semiconductor substrate. The next step is to deposit the material, e.g. hard carbon, onto the oxide layer at a predetermined thickness. Next, a photo resist layer is deposited on the substrate that forms the area where the ESD switch is located (i.e. adjacent to the region of the IC where the pad(s) will be formed). The remaining portions where the hard carbon and oxide layer were deposited are next etched away to leave the area where the ESD switch is to be located. Another oxide layer is then deposited on the hard carbon on the area of interest followed by another photo resist layer. The excess portions are again etched leaving the hard carbon encapsulated in oxide with a strip of silicon neighboring the enveloped hard carbon. Optionally, it may be desired to have an electrical connection of carbon with silicon in some areas. In that case, the oxide layer can be omitted or etched away in the areas where direct contact of carbon with silicon is desired. Next, amorphous silicon is then deposited into the envelope followed by an epitaxial silicon layer wherein the active region of the ESD switch is formed. Lastly, the excess amorphous silicon and unneeded oxide are etched from the rest of the wafer. The foregoing fabrication method may be applied to the embodiments discussed with FIG. 6 through FIG. 9.

Additional fabrication techniques are also contemplated by the present invention. First and foremost, the manufacturing of ESD devices should be achieved so that mechanically strong bonds are formed between the different materials contained within the device. Specific deposition techniques, for example, are employed to assure strong bonding between consecutive deposited layers.

A first such technique is to use a uniform deposition temperature for all materials, appropriately near 400° C., for example. By using the same deposition temperature for all materials, the invention minimizes fabrication stresses between the material layers caused by different thermal expansion coefficients of materials. By choosing the deposition temperature to be between room temperature and that achieved during ESD, the present invention aims to optimize the range of thermal stresses so that they are not too high, either at room temperature or during an ESD event. The basic principle is that inter-layer thermal stresses increase with the departure from stress-free deposition temperature. Prolonged annealing is another technique to improve the strength and ductility of materials in the manufacturing of ESD devices. A preferred annealing temperature for exemplary materials of the present invention is approximately 600° C.

An additional manufacturing and design technique is to eliminate sharp corners when fabricating and etching the components of the ESD device. By using appropriate deposition and etching techniques, sharp corners between adjoining materials should be minimized in favor of rounded corners. Generally, the geometry of corners and notches should be as smooth as practically achievable to minimize the mechanical stress at which crack propagation occurs.

An alternative technique contemplated by the present invention is to apply a passivation layer that is stiff and strong with an optimal thickness. A strong passivation layer will contain the expansive thermal stresses and maintain them within the compressive, rather than tensile, range. This helps prevent delamination, material separation and crack propagation. Further, the passivation layer should be ductile, rather than brittle, to prevent the layer from cracking and provide some damping of elastic waves caused by fast ESD events.

It should be appreciated that the foregoing description of the preferred embodiments of the present invention may be modified in a variety of different ways, which should be apparent to those skilled in the art from the above teachings. Accordingly, the present invention should not be limited in any way to the illustrated embodiments as the present invention in its various aspects encompasses all such modifications and variations thereof which are too numerous to describe in specific detail herein. While the invention has been illustrated and described by means of specific embodiments, it is to be understood that numerous changes and modifications may be made therein without departing from the intent and scope of the invention as defined in the appended claims.

What is claimed is:

1. The integrated circuit incorporating an Electrostatic Discharge (ESD) protection device comprising:

a semiconductor substrate;

an electrical contact pad;

a plurality of active devices formed on the substrate;

a first connector formed of a first electrically conductive material connecting the plurality of active devices; and an ESD switch coupled to the pad, at least in part via a second connector, said ESD switch having an active device region in the semiconductor substrate, and wherein said active device region has a length, said second connector electrically connected to the ESD switch comprising material more resistant to thermo-mechanical expansion than said first connector formed of said first electrical conductive material wherein the second connector extends away from the substrate a distance substantially or greater than to one-half of the length of the active device region.

2. The integrated circuit incorporating an Electrostatic Discharge (ESD) protection device according to claim 1, wherein said material substantially more resistant to thermo-mechanical expansion has a thermal expansion coefficient lower than approximately $10 \times 10^{-6}$ $K^{-1}$.

3. The integrated circuit incorporating an Electrostatic Discharge (ESD) protection device according to claim 1, wherein said material substantially more resistant to thermo-mechanical expansion has a melting temperature higher than approximately 1500° K.

4. The integrated circuit incorporating an Electrostatic Discharge (ESD) protection device according to claim 1, wherein said material substantially more resistant to thermo-mechanical expansion has a tensile strength higher than approximately 200 MPa (Mega Pascals).

5. The integrated circuit incorporating an Electrostatic Discharge (ESD) protection device according to claim 1, wherein said material substantially more resistant to thermo-mechanical expansion has a fracture toughness approximately higher than 1.0 MPa $m^{1/2}$.

6. The integrated circuit incorporating an Electrostatic Discharge (ESD) protection device according to claim 1, wherein the ESD switch is a MOSFET transistor and the active device region comprises:

a source region;

a drain region; and a channel region between the source region and the drain region.

7. The integrated circuit incorporating an Electrostatic Discharge (ESD) protection device according to claim 6, wherein the first connector is composed of Al, Cu or an alloy of Al and Cu.

8. The integrated circuit incorporating an Electrostatic Discharge (ESD) protection device according to claim 1, wherein said material resistant to thermo-mechanical expansion is composed primarily of titanium nitride (TiN).

9. The integrated circuit incorporating an Electrostatic Discharge (ESD) protection device according to claim 1, wherein said material resistant to thermo-mechanical expansion is composed primarily of carbon (C).

10. The integrated circuit incorporating an Electrostatic Discharge (ESD) protection device according to claim 1, wherein said material resistant to thermo-mechanical expansion is composed primarily of an alloy of aluminum (Al) and TiN.

* * * * *